United States Patent [19]

Higashiyama

[11] Patent Number: 4,861,695

[45] Date of Patent: Aug. 29, 1989

[54] LIGHT-SENSITIVE RECORDING MEDIUM, CARTRIDGE ENCASING SAME, AND IMAGE RECORDING SYSTEM THEREFOR

[75] Inventor: Shunichi Higashiyama, Nagoya, Japan

[73] Assignee: Brother Kogyo Kabushiki, Aichi, Japan

[21] Appl. No.: 256,972

[22] Filed: Oct. 13, 1988

[30] Foreign Application Priority Data

Oct. 14, 1987 [JP] Japan .................. 62-156920[U]
Oct. 15, 1987 [JP] Japan .................. 62-260435

[51] Int. Cl.⁴ .................................. G03C 1/72
[52] U.S. Cl. .................................. 430/138; 430/496; 430/501; 430/523; 430/531; 430/538; 430/642; 206/316.1; 206/578; 354/275; 355/27
[58] Field of Search ............ 430/138, 496, 501, 523, 430/531, 538, 642, 643, 911; 206/316, 409, 397, 395, 578; 354/87, 89, 275; 355/27

[56] References Cited

U.S. PATENT DOCUMENTS

| 4,405,227 | 9/1983 | Inoue et al. | 355/27 |
| 4,510,228 | 4/1985 | Tsubai et al. | 430/229 |
| 4,598,041 | 6/1986 | Hara et al. | 430/216 |
| 4,713,312 | 12/1987 | Adair et al. | 430/138 |
| 4,733,777 | 3/1988 | Van Geyte et al. | 206/316 |

Primary Examiner—Paul R. Michl
Assistant Examiner—Hoa Van Le
Attorney, Agent, or Firm—Oliff & Berridge

[57] ABSTRACT

A light-sensitive recording medium comprising a base sheet composed of a water-soluble material having carried thereon light-sensitive microcapsules encapsulating a dye precursor; a cartridge encasing a light-sensitive recording medium, which is composed of a water-soluble material and has light-shielding property; and an image recording system involving at least one of the light-sensitive recording medium and the cartridge are disclosed.

7 Claims, 2 Drawing Sheets

LIGHT-SENSITIVE RECORDING MEDIUM, CARTRIDGE ENCASING SAME, AND IMAGE RECORDING SYSTEM THEREFOR

FIELD OF THE INVENTION

The present invention relates to a light-sensitive recording medium, a cartridge encasing the recording medium and an image recording system using them.

BACKGROUND OF THE INVENTION

Hitherto, light-sensitive recording media comprising a synthetic resin sheet (e.g., a polyethylene terephthalate sheet) having provided thereon light-sensitive microcapsules containing a dye precursor, a photocurable resin and a polymerization initiator as main contents are known, as described in, for example, Japanese Patent Application (OPI) Nos. 17432/83, 88739/83 (U.S. Pat. No. 4,399,209) and 88740/83 (U.S. Pat. No. 4,440,846). (The term (OPI) herein used means an unexamined and published patent application.) The recording medium is subjected to light exposure according to an optical information to imagewise cure the microcapsules, and brought into contact with a sheet carrying thereon a substance capable of forming color upon reaction with the dye precursor (hereafter merely referred to as developer sheet), followed by applying pressure thereto, whereby the unexposed microcapsules are ruptured so that a color forming reaction of the dye precursor with the substance occurs to form an image on the developer sheet. In general, this type of light-sensitive recording media is put in a cartridge and mounted as such in an image recording apparatus. Materials for the cartridge have been mainly concerned in terms of light-shielding property, mechanical properties and cost, and high impact-resistant polystyrene resins and polyvinyl chloride resins compounded with carbon black are usually used.

After pressure development of the light-sensitive recording medium, a latent image which can be obserbed by naked eyes remains on the recording medium due to difference in surface state of the microcapsule-carrying surface between the areas of ruptured microcapsules and non ruptured microcapsules. Therefore, care must be taken such that a secret is not leaked from such a used recording medium. Cutting the recording medium into small pieces to prevent the leakage is cost-consuming and is not desired.

Further, since cartridges for the light-sensitive recording medium as described above are abolished after the recording medium encased is used up, those made of polystyrene resins or polyvinyl chloride resins are troublesome in their abolishing treatment with respect to cost for burning up, air polution, etc.

Commonly assigned U.S. patent application, has been filed, entitled "IMAGE RECORDING APPARATUS HAVING MEANS FOR RENDERING INPUT OR INTERMEDIATE IMAGE UNREADABLE" bearing Ser. No. 183,057 filed Apr. 19, 1988.

SUMMARY OF THE INVENTION

An object of the present invention is to provide a light-sensitive recording medium and a cartridge encasing the recording medium, which are free from the above problems in their abolishment, and an image recording system allowing a simple and economical abolishing treatment.

The above object is accomplished by a light-sensitive recording medium and a cartridge therefor, wherein a water-soluble material is used.

That is, the present invention is a light-sensitive recording medium comprising a base sheet made of a water-soluble material having provided thereon light-sensitive microcapsules encapsulating a dye precursor, and a cartridge therefor which has light-shielding property and is made of a water-soluble material.

Another embodiment of the present invention is an image recording system comprising a light-shielding cartridge encasing a light-sensitive recording material, an optical means for exposing to light the light-sensitive recording material drawn out from the cartridge, and a means for developing the light-exposed recording medium, wherein at least one of the cartridge and a base sheet of the light-sensitive recording medium is made of a water-soluble material.

BRIEF DESCRIPTION OF THE DRAWINGS

In FIGS. 1 to 3, numeral 1 is a light-sensitive recording medium, 2 is a water-soluble base sheet, 3 is a microcapsule, 10 is a cartridge encasing the light-sensitive recording medium, 14 is an optical system, 20 is a roller, and 21 is an opening for drawing out the light-sensitive recording medium.

DETAILED DESCRIPTION OF THE INVENTION

Figure 1:
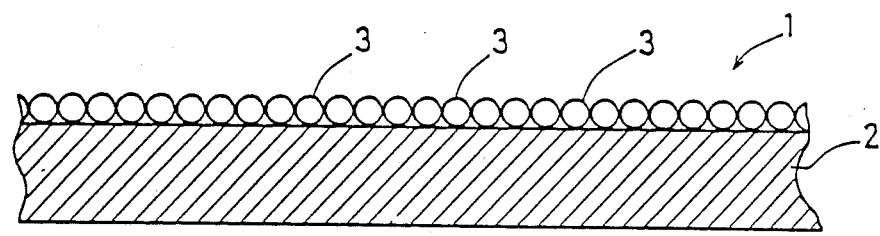
FIG. 1 is an enlarged sectional view of one embodiment of the light-sensitive recording medium of the present invention.

Light-sensitive recording medium 1 shown in FIG. 1 comprises base sheet 2 made of a water-soluble material having carried thereon photocurable microcapsules 3 encapsulating a dye precursor.

Examples of the water-soluble material which can be used in the present invention includes water-soluble paper, water-soluble film of polymer such as partially saponified polyvinyl alcohol, polyethylene oxide, polyethylene glycol, etc., as well as water-soluble film of saccharide such as amylose, dextrin, methyl cellulose, hydroxyethyl cellulose, hydroxypropyl cellulose, etc. Commercially available are, for example, "DISSOLVO" (water-soluble paper produced by Mishima Seishi Co.), and "Water-soluble Kurare Vinylon Film" and "Hiselon" (partially saponified polyvinyl alcohol films produced by Kurare Co. and Nichigo Film Co., respectively).

For the dye precursors encapsulated in microcapsule 3 there may be used triarylmethane compounds such as Copikem X, Copikem N, Copikem X1 and Copikem XX (produced by Hilton-Davis Co.), Reaktyellow (produced by BASF Co.) and Crystal Violet lactone, bisphenylmethane compounds, xanthene compounds, fluoran compounds, thiazine compounds, spiropyran compounds, and analogs thereto, which may be used alone or as a mixture thereof, as described in, for example, U.S. patent application No. 620,944 filed June 15, 1984. Examples of the photocurable resin which is used together with the dye precursor in microcapsule 3 include ethylenically unsaturated acid esters of polyhydric alcohols, such as ethylene glycol dimethacrylate, triethylene glycol dimethacrylate, trimethylolpropane triacrylate (TMPTA), trimethylolpropane trimethacrylate, pentaerythritol triacrylate and pentaerythritol trimethacrylate. Examples of the polymerization initiator include diaryl ketone compounds such as benzophenone, Michler's ketone, isopropylxanthone and isopropylthioxanthone, benzoyl alkyl ethers such as benzoyl methyl ether, and ketocumarin compounds. The dye precursor, photocurable resin and polymerization initiator are encapsulated to produce microcapsules 3 in a conventional method such as coacervation method and interfacial polymerization method.

The microcapsules are mixed with other additives, e.g., a water-soluble binder, a filler, a viscosity control agent, etc. and are coated on water-soluble base sheet 2 by a roll coater, a spray coater, a doctor knife coater, a bar coater and the like, thus producing pressure-developable light-sensitive recording medium 1. Partially saponified polyvinyl alcohol, acrylic emulsion-type binders and vinyl acetate emulsion-type binders can be used for the water-soluble binder.

Figure 2:
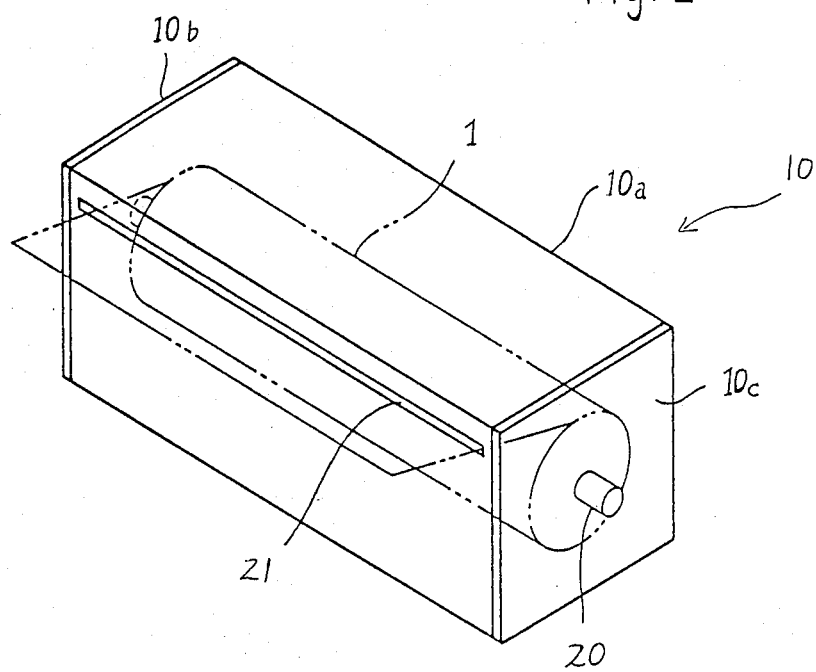
FIG. 2 is an exterior view of one embodiment of the cartridge encasing the light-sensitive recording medium of the present invention.

As shown in FIG. 2, cartridge 10 encasing the light-sensitive recording medium of the present invention comprises rectangular parallelepiped case 10a having provided therein axial roller 20 between side plates 10b and 10c of case 10a, wherein the roller turns freely on its axis and a strip sheet of the light-sensitive recording medium is rolled up on the roll. The cartridge has opening 21 for drawing out the rolled strip sheet of the light-sensitive recording medium in one side of case 10a. For materials of the cartridge and the axial roll, water-soluble materials as used for the base sheet of the above recording medium can also be used. Further, fine particles imparting good light-shielding property to the cartridge, for example, carbon black, etc. can be added in a proper amount in the water-soluble material for the cartridge. Average diameter of fine particles is preferably from 1 to 5 μm.

The present invention is explained in more detail with reference to the following Examples, but the invention should not be construed to be limited thereto.

EXAMPLE 1

A color forming composition as described below was coated on a water-soluble base sheet ("DISSOLVO" produced by Mishima Seishi Co., thickness: 75 μm), followed by drying at 100° C. for 1 minute, whereby a light-sensitive recording medium having a color forming layer of 35 μm in dry thickness was prepared.

| Color Forming Composition | |
|---|---|
| Microcapsules | 100 parts by weight |
| p-Phenylphenol | 50 parts by weight |
| Phenol novolak | 50 parts by weight |
| Polyvinyl alcohol | 15 parts by weight |

The microcapsules were prepared by coacervation method using as a core composition a toluene solution containing a dye precursor, a photocurable resin and a polymerization initiator, and gelatin as a wall material.

EXAMPLE 2

The same procedure as in Example 1 was repeated to prepare a light-sensitive recording medium, except that a film of partially saponified polyvinyl alcohol ("Water-soluble Kurare Vinylon Film" produced by Kurare Co., thickness: 75 μm) was used as a base sheet.

EXAMPLE 3

200 parts by weight of water (40° C.), 45 parts by weight of water-soluble paper ("DISSOLVO"), 45 parts by weight of partially saponified polyvinyl alcohol ("Water-soluble Kurare Vinylon Film") and 10 parts by weight of fine particles of carbon black (average diameter of fine particles: 3 μm) were thoroughly mixed. The thus prepared composition was cooled to 10° C., poured into a mold, and subjected to preliminary drying at room temperature (20° C.) and a relative humidity of 20% and then to complete drying at 50° C. The resulting molded board was cut into four rectangular plates and two side plates, and they were bonded with a water-soluble adhesive to form a cartridge as shown in FIG. 2.

EXAMPLE 4

Both surfaces of water-soluble paper ("DISSOLVO") were sprayed with carbon black fine particles and laminated thereon with films of partially saponified polyvinyl alcohol ("Water-soluble Kurare Vinylon Film"), followed by drying at 60° C. to obtain a light-shielding sheet having a thickness of 200 μm. Five to ten sheets thus obtained were laminated one after another using a water-soluble adhesive to prepare a board with which a cartridge was produced in the same manner as in Example 3.

Figure 3:
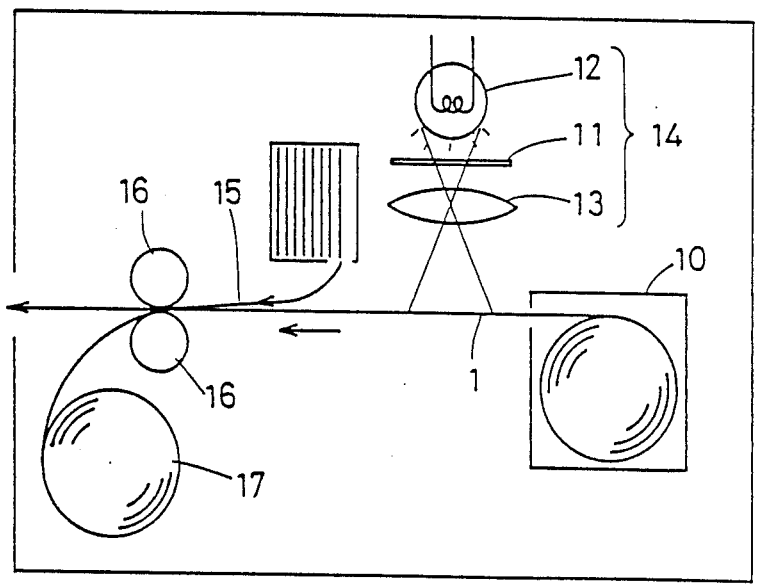
FIG. 3 illustrates a brief construction of one embodiment of the image recording system of the present invention.

The light-sensitive recording medium as prepared in Example 1 or 2 is encased in the cartridge as prepared in Example 3 or 4, as shown in FIG. 2, and the cartridge ia mounted in the image recording system as shown in FIG. 3. In the image recording system, light-sensitive recording medium 1 encased in cartridge 10 is drawn out in the direction as indicated by arrow and is exposed to light from optical system 14 comprising light-transmission type original 11, light source 12 and lens 13. Thereafter, the light-exposed recording medium is brought into contact with developer sheet 15 and passed through between a pair of pressure rollers 16 to effect pressure development, whereby the image of original 11 is reproduced on developer sheet 15 which is driven out from the apparatus. After the development, light-sensitive recording medium 1 per se is taken up on roller 17.

When the light-sensitive recording medium 1 encased in the cartridge 10 is used up, the take-up roller 17 with the used recording medium 1 is taken away from the apparatus and then subjected to abolishing treatment. When the used recording medium 1 rolled on the take-up roller 17 is immersed in water, the base sheet 2 of the rolled recording medium 1 gradually dissolves from the outer surface thereof so that the microcapsules 3 on the base sheet 2 are also disjointed and dispersed in water. Thus the used recording medium 1 can be completely abolished with ease. After dissolution of the recording medium 1, water and attached matter are wiped off from the surface of the take-up roller 17 which is then mounted on the apparatus again.

The cartridge 10 has light-shielding property that prevents the encased light-sensitive recording medium 1 from careless light exposure. After using up the recording medium 1, the cartridge 10 is removed from the apparatus, and it can be abolished merely by immersing in water as well as the used recording medium as described above. The waste water dissolving the cartridge is subjected to known post-treatment, or materials for the cartridge may be recovered from the water.

In the present invention, the light-sensitive recording medium 1 is not necessarily in roll form but may be in the form of cut sheets. Further, the shape of the cartridge 10 is not limited to a rectangular parallelepiped but may be a cylinder or a polygonal pipe. The roller 20 on which the light-sensitive recording medium 1 is rolled in the cartridge 10 may be made of a water-insoluble material. In the case, the roller 20 can be re-used after the abolishing treatment of the cartridge.

In the image recording system of the present invention, at least one of the base sheet of the light-sensitive recording medium and the cartridge is made of a water-soluble material, and preferably both are made of a water-soluble material.

The light-sensitive recording medium of the present invention can be abolished, after use, merely by immersing in water, so that secrecy is easily retained. Further, the cartridge of the present invention not only keeps the encased light-sensitive recording medium from careless light-exposure but also has the advantage that it can be abolished merely by dissolving in water. Since the waste water is biologically harmless, the abolishing treatment of the present invention is an "energy-saving" process and is economical, as compared with conventional treatments such as burning up, and further it is free from problems such as air pollution and soil contamination which have been apprehended.

While the invention has been described in detail and with reference to specific embodiments thereof, it will be apparent to one skilled in the art that various changes and modifications can be made therein without departing from the spirit and scope thereof.

What is claimed is:

1. A light-sensitive recording medium comprising a base sheet composed of a water-soluble material having carried thereon light-sensitive microcapsules encapsulating a dye precursor.

2. A light-sensitive recording medium as claimed in claim 1, wherein said water-soluble material is a paper composed of pulp and a water-soluble binder, or a film of partially saponified polyvinyl alcohol.

3. A cartridge encasing a light-sensitive recording medium, which is composed of a water-soluble material and has light-shielding property.

4. A cartridge as claimed in claim 3, wherein said water soluble-material is a paper composed of pulp and a water-soluble binder, or a film of partially saponified polyvinyl alcohol.

5. A cartridge as claimed in claim 3, which contains fine particles of carbon black.

6. An image recording system comprising a light-shielding cartridge encasing a light-sensitive recording medium, an optical means for exposing to light the light-sensitive recording medium drawn out from the cartridge, and a means for developing the light-exposed recording medium, wherein at least one of the cartridge and a base sheet of the light-sensitive recording medium is composed of a water-soluble material.

7. An image recording system as claimed in claim 6, wherein said water-soluble material is a paper composed of pulp and a water-soluble binder, or a film of partially saponified polyvinyl alcohol.

* * * * *